(12) United States Patent
Magro et al.

(10) Patent No.: US 11,797,369 B2
(45) Date of Patent: *Oct. 24, 2023

(54) ERROR REPORTING FOR NON-VOLATILE MEMORY MODULES

(71) Applicant: Advanced Micro Devices, Inc., Santa Clara, CA (US)

(72) Inventors: James R. Magro, Lakeway, TX (US); Kedarnath Balakrishnan, Bangalore (IN); Vilas Sridharan, Brookline, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/864,804

(22) Filed: Jul. 14, 2022

(65) Prior Publication Data

US 2023/0004459 A1 Jan. 5, 2023

Related U.S. Application Data

(63) Continuation of application No. 16/730,113, filed on Dec. 30, 2019, now Pat. No. 11,392,441.

(51) Int. Cl.
*G06F 11/07* (2006.01)
*G06F 3/06* (2006.01)
*G06F 11/14* (2006.01)

(52) U.S. Cl.
CPC ........ *G06F 11/0772* (2013.01); *G06F 3/0679* (2013.01); *G06F 11/073* (2013.01); *G06F 11/141* (2013.01)

(58) Field of Classification Search
CPC .... G06F 3/0679; G06F 3/0688; G06F 11/073; G06F 11/0766; G06F 11/0769;
(Continued)

(56) References Cited

U.S. PATENT DOCUMENTS 10,713,128 B2 7/2020 Nguyen et al.
2008/0002590 A1 1/2008 Thomas et al.
(Continued)

FOREIGN PATENT DOCUMENTS

KR 10-2011-009956 A 9/2011

OTHER PUBLICATIONS

International Search Report and Written Opinion for International Application No. PCT/US2020/063702, dated Mar. 11, 2021, 7 pages.

*Primary Examiner* — Gabriel Chu
(74) *Attorney, Agent, or Firm* — Polansky & Associates, P.L.L.C.; Paul J. Polansky; Nathan H. Calvert

(57) ABSTRACT

A memory controller includes a memory channel controller adapted to receive memory access requests and dispatch associated commands addressable in a system memory address space to a non-volatile storage class memory (SCM) module. The non-volatile error reporting circuit identifies error conditions associated with the non-volatile SCM module and maps the error conditions from a first number of possible error conditions associated with the non-volatile SCM module to a second, smaller number of virtual error types for reporting to an error monitoring module of a host operating system, the mapping based at least on a classification that the error condition will or will not have a deleterious effect on an executable process running on the host operating system.

20 Claims, 5 Drawing Sheets

(58) Field of Classification Search
CPC ............ G06F 11/0772; G06F 11/0775; G06F 11/0781; G06F 11/0784; G06F 11/3037
See application file for complete search history.

(56) References Cited

U.S. PATENT DOCUMENTS

| | | |
|---|---|---|
| 2010/0293436 A1 | 11/2010 | Coteus et al. |
| 2011/0216588 A1 | 9/2011 | Kim et al. |
| 2016/0259563 A1 | 9/2016 | Driever et al. |
| 2017/0060657 A1 | 3/2017 | Healy et al. |
| 2017/0123879 A1 | 5/2017 | Donlin |
| 2019/0163562 A1 | 5/2019 | Dubeyko et al. |
| 2019/0303282 A1 | 10/2019 | Kim et al. |
| 2020/0117533 A1 | 4/2020 | Nijhawan et al. |
| 2020/0142825 A1 | 5/2020 | Barczak |
| 2021/0049062 A1 | 2/2021 | Balakrishnan et al. |
| 2021/0200649 A1 | 7/2021 | Wang et al. |

ERROR REPORTING FOR NON-VOLATILE MEMORY MODULES

This application is a continuation of U.S. patent application Ser. No. 16/730,113, filed Dec. 30, 2019, and entitled "ERROR REPORTING FOR NON-VOLATILE MEMORY MODULES," which is incorporated by reference herein in its entirety.

BACKGROUND

Computer systems typically use inexpensive and high-density dynamic random access memory (DRAM) chips for main memory. Most DRAM chips sold today are compatible with various double data rate (DDR) DRAM standards promulgated by the Joint Electron Devices Engineering Council (JEDEC). DDR memory controllers are used to manage the interface between various memory accessing agents and DDR DRAMs according to published DDR standards.

A non-volatile dual-inline memory module with persistent storage ("NVDIMM-P") is a storage class memory that in some applications can be used in place of standard DDR DIMMs but that includes persistent memory. However, these memories include multiple types of error conditions that are different from DDR error conditions. Furthermore, the error conditions associated with NVDIMM-Ps have different effects on the operating system and running processes that use the memory than the effects of error conditions associated with standard DDR DIMMs.

Figure 1:
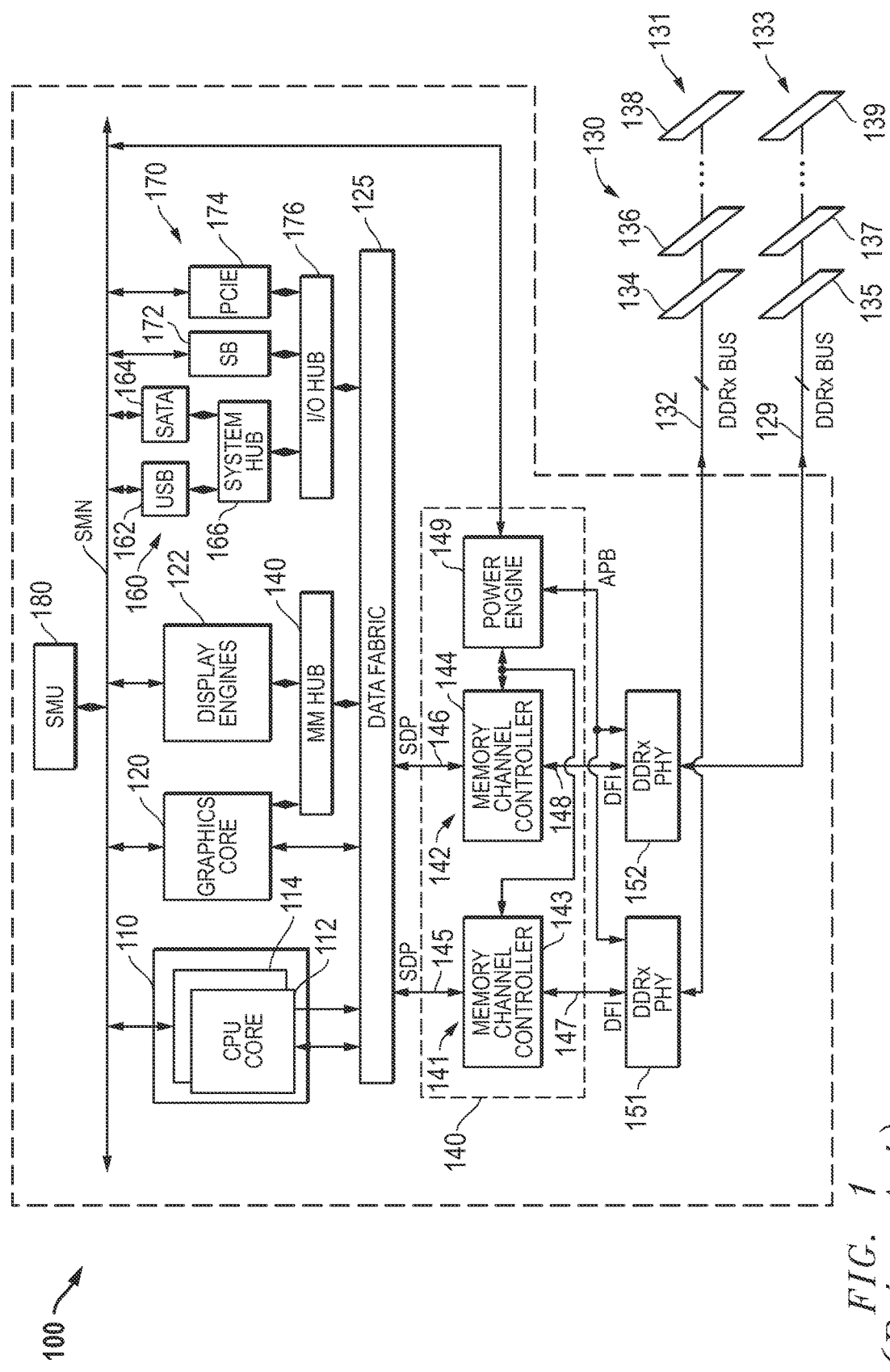
FIG. 1 illustrates in block diagram form an accelerated processing unit (APU) and memory system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory controller includes a command queue, a memory interface queue, and a non-volatile error reporting circuit. The command queue has a first input for receiving memory access commands including volatile reads, volatile writes, non-volatile reads, and non-volatile writes, and an output, and has a plurality of entries. The memory interface queue has an input coupled to the output of the command queue, and an output for coupling to a non-volatile storage class memory (SCM) module. The non-volatile error reporting circuit identifies error conditions associated with the non-volatile DIMM and maps the error conditions from a first number of possible error conditions associated with the non-volatile SCM module to a second, smaller number of virtual error types for reporting to an error monitoring module of a host operating system. The mapping is based at least on a classification that the error condition will or will not have a deleterious effect on an executable process running on the host operating system.

A method includes receiving a plurality of memory access requests including volatile memory reads, volatile memory writes, non-volatile memory reads, and non-volatile memory writes. The method places memory access commands for fulfilling the memory access requests in a memory interface queue and transmits the memory access commands from the memory interface queue to a memory channel coupled to a non-volatile storage class memory (SCM) module. Based on information received over the memory channel, error conditions associated with the memory channel are identified. The error conditions are mapped from a first number of possible error conditions associated with the non-volatile SCM module to a second, smaller number of virtual error types for reporting to an error monitoring module of a host operating system, the mapping based at least on a classification that the error condition will or will not have a deleterious effect on an executable process running on the host operating system.

A data processing system includes a central processing unit, a data fabric coupled to the central processing unit, and a memory controller coupled to the data fabric for fulfilling memory access requests made through the data fabric. The memory controller includes a command queue, a memory interface queue, and a non-volatile error reporting circuit. The command queue has a first input for receiving memory access commands including volatile reads, volatile writes, non-volatile reads, and non-volatile writes, and an output, and has a plurality of entries. The memory interface queue has an input coupled to the output of the command queue, and an output for coupling to a non-volatile storage class memory (SCM) module. The non-volatile error reporting circuit identifies error conditions associated with the non-volatile SCM module and maps the error conditions from a first number of possible error conditions associated with the non-volatile SCM module to a second, smaller number of virtual error types for reporting to an error monitoring module of a host operating system, the mapping based at least on a classification that the error condition will or will not have a deleterious effect on an executable process running on the host operating system.

FIG. 1 illustrates in block diagram form an accelerated processing unit (APU) 100 and memory system 130 known in the prior art. APU 100 is an integrated circuit suitable for use as a processor in a host data processing system, and includes generally a central processing unit (CPU) core complex 110, a graphics core 120, a set of display engines 122, a memory management hub 140, a data fabric 125, a set of peripheral controllers 160, a set of peripheral bus controllers 170, and a system management unit (SMU) 180.

CPU core complex 110 includes a CPU core 112 and a CPU core 114. In this example, CPU core complex 110 includes two CPU cores, but in other embodiments CPU core complex 110 can include an arbitrary number of CPU cores. Each of CPU cores 112 and 114 is bidirectionally connected to a system management network (SMN), which forms a control fabric, and to data fabric 125, and is capable of providing memory access requests to data fabric 125. Each of CPU cores 112 and 114 may be unitary cores, or may further be a core complex with two or more unitary cores sharing certain resources such as caches.

Graphics core 120 is a high performance graphics processing unit (GPU) capable of performing graphics operations such as vertex processing, fragment processing, shading, texture blending, and the like in a highly integrated and parallel fashion. Graphics core 120 is bidirectionally connected to the SMN and to data fabric 125, and is capable of providing memory access requests to data fabric 125. In this regard, APU 100 may either support a unified memory architecture in which CPU core complex 110 and graphics core 120 share the same memory space, or a memory architecture in which CPU core complex 110 and graphics core 120 share a portion of the memory space, while graphics core 120 also uses a private graphics memory not accessible by CPU core complex 110.

Display engines 122 render and rasterize objects generated by graphics core 120 for display on a monitor. Graphics core 120 and display engines 122 are bidirectionally connected to a common memory management hub 140 for uniform translation into appropriate addresses in memory system 130, and memory management hub 140 is bidirectionally connected to data fabric 125 for generating such memory accesses and receiving read data returned from the memory system.

Data fabric 125 includes a crossbar switch for routing memory access requests and memory responses between any memory accessing agent and memory management hub 140. It also includes a system memory map, defined by basic input/output system (BIOS), for determining destinations of memory accesses based on the system configuration, as well as buffers for each virtual connection.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral bus controllers 170 include a system controller or "Southbridge" (SB) 172 and a Peripheral Component Interconnect Express (PCIe) controller 174, each of which is bidirectionally connected to an input/output (I/O) hub 176 and to the SMN bus. I/O hub 176 is also bidirectionally connected to system hub 166 and to data fabric 125. Thus, for example a CPU core can program registers in USB controller 162, SATA interface controller 164, SB 172, or PCIe controller 174 through accesses that data fabric 125 routes through I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through the SATA interface.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 includes one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states.

Memory management hub 140 and its associated physical interfaces (PHYs) 151 and 152 are integrated with APU 100 in this embodiment. Memory management hub 140 includes memory channels 141 and 142 and a power engine 149. Memory channel 141 includes a host interface 145, a memory channel controller 143, and a physical interface 147. Host interface 145 bidirectionally connects memory channel controller 143 to data fabric 125 over a serial presence detect link (SDP). Physical interface 147 bidirectionally connects memory channel controller 143 to PHY 151, and conforms to the DDR PHY Interface (DFI) Specification. Memory channel 142 includes a host interface 146, a memory channel controller 144, and a physical interface 148. Host interface 146 bidirectionally connects memory channel controller 144 to data fabric 125 over another SDP. Physical interface 148 bidirectionally connects memory channel controller 144 to PHY 152, and conforms to the DFI Specification. Power engine 149 is bidirectionally connected to SMU 180 over the SMN bus, to PHYs 151 and 152 over the APB, and is also bidirectionally connected to memory channel controllers 143 and 144. PHY 151 has a bidirectional connection to memory channel 131. PHY 152 has a bidirectional connection memory channel 133.

Memory management hub 140 is an instantiation of a memory controller having two memory channel controllers and uses a shared power engine 149 to control operation of both memory channel controller 143 and memory channel controller 144 in a manner that will be described further below. Each of memory channels 141 and 142 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Memory system 130 includes a memory channel 131 and a memory channel 133. Memory channel 131 includes a set of dual inline memory modules (DIMMs) connected to a Dedra bus 132, including representative DIMMs 134, 136, and 138 that in this example correspond to separate ranks. Likewise, memory channel 133 includes a set of DIMMs connected to a DDRx bus 129, including representative DIMMs 135, 137, and 139.

APU 100 operates as the central processing unit (CPU) of a host data processing system and provides various buses and interfaces useful in modern computer systems. These interfaces include two double data rate (DDRx) memory channels, a PCIe root complex for connection to a PCIe link, a USB controller for connection to a USB network, and an interface to a SATA mass storage device.

APU 100 also implements various system monitoring and power saving functions. In particular one system monitoring function is thermal monitoring. For example, if APU 100 becomes hot, then SMU 180 can reduce the frequency and voltage of CPU cores 112 and 114 and/or graphics core 120. If APU 100 becomes too hot, then it can be shut down entirely. Thermal events can also be received from external sensors by SMU 180 via the SMN bus, and SMU 180 can reduce the clock frequency and/or power supply voltage in response.

Figure 2:
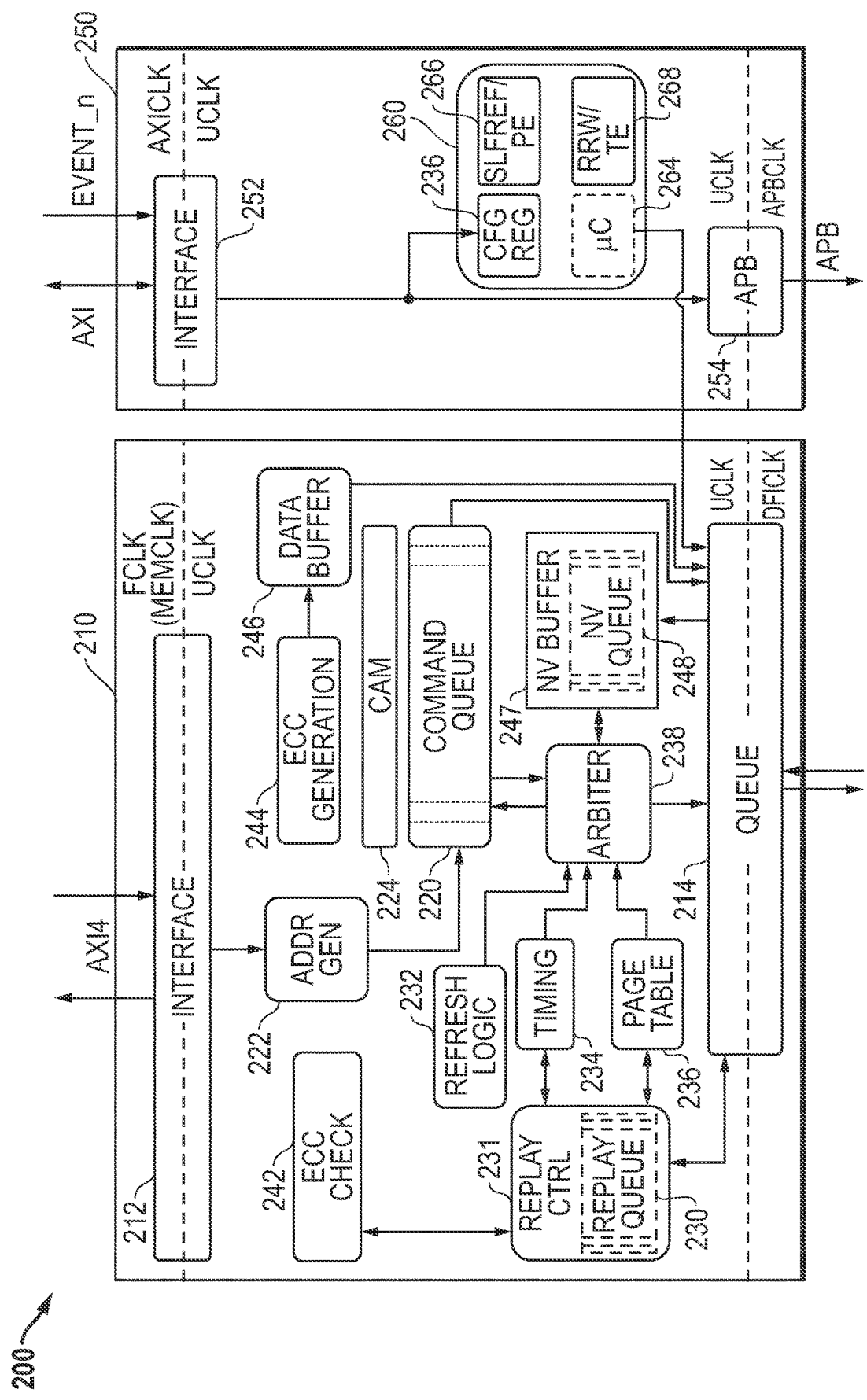
FIG. 2 illustrates in block diagram form a memory controller suitable for use in an APU like that of FIG. 1 according to some embodiments.

FIG. 2 illustrates in block diagram form a memory controller 200 that is suitable for use in an APU like that of FIG. 1. Memory controller 200 includes generally a memory channel controller 210 and a power controller 250. Memory channel controller 210 includes generally an interface 212, a memory interface queue 214, a command queue 220, an address generator 222, a content addressable memory (CAM) 224, replay control logic 231 including a replay queue 230, a refresh logic block 232, a timing block 234, a page table 236, an arbiter 238, an error correction code (ECC) check circuit 242, an ECC generation block 244, a data buffer 246, a non-volatile (NV) buffer 247, and a NV queue 248.

Interface 212 has a first bidirectional connection to data fabric 125 over an external bus, and has an output. In memory controller 200, this external bus is compatible with the advanced extensible interface version four specified by ARM Holdings, PLC of Cambridge, England, known as "AXI4", but can be other types of interfaces in other embodiments. Interface 212 translates memory access requests from a first clock domain known as the FCLK (or MEMCLK) domain to a second clock domain internal to memory controller 200 known as the UCLK domain. Similarly, memory interface queue 214 provides memory accesses from the UCLK domain to a DFICLK domain associated with the DFI interface.

Address generator 222 decodes addresses of memory access requests received from data fabric 125 over the AXI4 bus. The memory access requests include access addresses in the physical address space represented in a normalized format. Address generator 222 converts the normalized addresses into a format that can be used to address the actual memory devices in memory system 130, as well as to efficiently schedule related accesses. This format includes a region identifier that associates the memory access request with a particular rank, a row address, a column address, a bank address, and a bank group. On startup, the system BIOS queries the memory devices in memory system 130 to determine their size and configuration, and programs a set of configuration registers associated with address generator 222. Address generator 222 uses the configuration stored in the configuration registers to translate the normalized addresses into the appropriate format. Address generator 222 decodes the address range of the memory, including NVDIMM-P memory, and stores a decoded signal indicating whether the memory access request is a request to NVDIMM-P in command queue 220. Arbiter 238 can then prioritize the NVDIMM-P requests with appropriate priority relative to other requests. Command queue 220 is a queue of memory access requests received from the memory accessing agents in APU 100, such as CPU cores 112 and 114 and graphics core 120. Command queue 220 stores the address fields decoded by address generator 222 as well other address information that allows arbiter 238 to select memory accesses efficiently, including access type and quality of service (QoS) identifiers. CAM 224 includes information to enforce ordering rules, such as write after write (WAW) and read after write (RAW) ordering rules.

Error correction code (ECC) generation block 244 determines the ECC of write data to be sent to the NVDIMM-P. ECC check circuit 242 checks the received ECC against the incoming ECC. Thus, a memory controller and data processing system as described herein expands the coverage of data integrity checking to provide end-to-end checking by leveraging a limited number of user bits that are stored in the NVDIMM-P device and available for comparison when the corresponding data is later read.

Replay queue 230 is a temporary queue for storing selected memory accesses picked by arbiter 238 that are awaiting responses, such as address and command parity responses. Replay control logic 231 accesses ECC check circuit 242 to determine whether the returned ECC is correct or indicates an error. Replay control logic 231 initiates and controls a replay sequence in which accesses are replayed in the case of a parity or ECC error of one of these cycles. Replayed commands are placed in the memory interface queue 214.

Refresh logic 232 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh logic 232 generates refresh commands periodically to prevent data errors caused by leaking of charge off storage capacitors of memory cells in DRAM chips. In addition, refresh logic 232 periodically calibrates ZQ to prevent mismatch in on-die termination resistance due to thermal changes in the system.

Arbiter 238 is bidirectionally connected to command queue 220 and is the heart of memory channel controller 210. It improves efficiency by intelligent scheduling of accesses to improve the usage of the memory bus. Arbiter 238 uses timing block 234 to enforce proper timing relationships by determining whether certain accesses in command queue 220 are eligible for issuance based on DRAM timing parameters. For example, each DRAM has a minimum specified time between activate commands, known as "$t_{RC}$". Timing block 234 maintains a set of counters that determine eligibility based on this and other timing parameters specified in the JEDEC specification, and is bidirectionally connected to replay queue 230. Page table 236 maintains state information about active pages in each bank and rank of the memory channel for arbiter 238, and is bidirectionally connected to replay queue 230.

NV buffer 247 stores NV read commands in NV queue 248, both for use in replay sequences, and for managing NV read responses. NV buffer 247 is bidirectionally connected to memory interface queue 214 for handling RD_RDY and SEND commands, as further described below.

In response to write memory access requests received from interface 212, ECC generation block 244 computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Power controller 250 generally includes an interface 252 to an advanced extensible interface, version one (AXI), an advanced peripheral bus (APB) interface 254, and a power engine 260. Interface 252 has a first bidirectional connection to the SMN, which includes an input for receiving an event signal labeled "EVENT_n" shown separately in FIG. 2, and an output. APB interface 254 has an input connected to the output of interface 252, and an output for connection to a PHY over an APB. Power engine 260 has an input connected to the output of interface 252, and an output connected to an input of memory interface queue 214. Power engine 260 includes a set of configuration registers 262, a microcontroller (μC) 264, a self refresh controller (SLFREF/PE) 266, and a reliable read/write timing engine (RRW/TE) 268. Configuration registers 262 are programmed over the AXI bus, and store configuration information to control the operation of various blocks in memory controller 200. Accordingly, configuration registers 262 have outputs connected to these blocks that are not shown in detail in FIG. 2.

Self refresh controller 266 is an engine that allows the manual generation of refreshes in addition to the automatic generation of refreshes by refresh logic 232. Reliable read/write timing engine 268 provides a continuous memory access stream to memory or I/O devices for such purposes as DDR interface maximum read latency (MRL) training and loopback testing.

Memory channel controller 210 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers 262 store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as quality of service (QoS) requirements. For example, arbiter 238 implements a preference for accesses to open pages to avoid the overhead of precharge and activation commands required to change memory pages, and hides overhead accesses to one bank by interleaving them with read and write accesses to another bank. In particular during normal operation, arbiter 238 normally keeps pages open in different banks until they are required to be precharged prior to selecting a different page.

Figure 3:
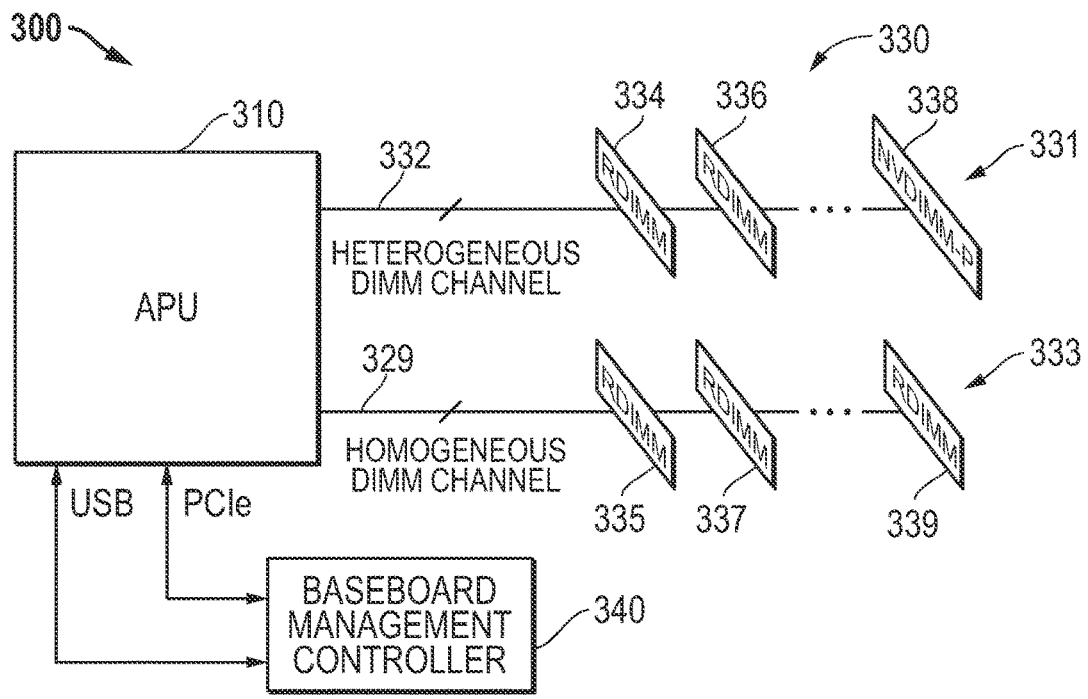
FIG. 3 illustrates in block diagram form a data processing system according to some embodiments.

FIG. 3 illustrates in block diagram form a data processing system 300 according to some embodiments. Data processing system 300 includes a memory system 330 and an APU 310, and a baseboard management controller (BMC) 340. APU 310 includes memory controllers like memory controller 200 (FIG. 2) supporting heterogenous memory channels to interface with memory system 330. In addition to normal DDRx memory channels, APU 310 supports NVDIMM-P 338 on a heterogenous memory channel 331 having both normal registered DIMMs or RDIMMs 334 and 336 connected over bus 332, in addition to a homogeneous memory channel 333 having only RDIMMs 335, 337, and 339 connected over bus 329. While in this embodiment heterogenous memory channel 331 connects to both NVDIMM-Ps and RDIMMs, the heterogenous memory channel has the ability to interface with all NVDIMM-P type DIMMs in some embodiments.

According to the draft NVDIMM-P standard, transactions between the memory controller on APU 310 and NVDIMM-P 338 are protected by "Link" ECC. Link ECC ensures data integrity for the data transfer between the memory controller and the NVDIMM over bus 332. In accordance with known ECC mechanisms, it protects against data corruption on the link caused by a random or transient error. The protection varies according to the ECC code used. The ECC may allow, for example, single-bit correction with multiple-bit error detection. In response to detecting an uncorrectable error, the memory controller can replay the transaction so that a transient or random error will not persist, and can also report both correctable and uncorrectable errors to the operating system.

BMC 340 is a specialized processor mounted to the host circuit board of data processing system 300 and connected to APU 310 for providing a control and monitoring capability. BMC 340 monitors the state of APU 310 and various other components (not shown separately) of data processing system 300 by receiving error reports and monitoring status registers and sensors. BMC 340 is connected to system communication busses such as the depicted peripheral component interconnect express (PCIe) bus and universal serial bus (USB), and may also monitor registers in various system components via an inter-integrated circuit bus to poll for error reports. External access to BMC functions is provided for remote monitoring and control, typically through a dedicated network interface or a connection to the network interface of data processing system 300.

While NVDIMM-P type DIMMs are described in this embodiment, other embodiments employ the techniques herein to interface with other types of storage class memory (SCM) modules over a heterogeneous memory channel. As used herein, SCM indicates a memory module with non-volatile memory that is addressable in the system memory space. The non-volatile memory in an SCM module can be buffered with RAM and/or paired with RAM on board the SCM module. The SCM memory address map appears alongside conventional DRAM population from the operating system (OS) perspective. The OS is typically aware that the SCM defined address range is a "different" type of memory than conventional memory. This distinction is to inform the OS that this memory may be more latent and has a persistent quality.

The OS can map the SCM memory as Direct Access memory or Filesystem Access memory. Direct Access implies the OS accessing the SCM address range as physical addressable memory. File system access implies the OS manages the persistent memory as part of the file system and manages access to the SCM via file-based API. Ultimately the request comes to the memory controller within the SCM address range independent of how the OS at a higher level manages the access.

Figure 4:
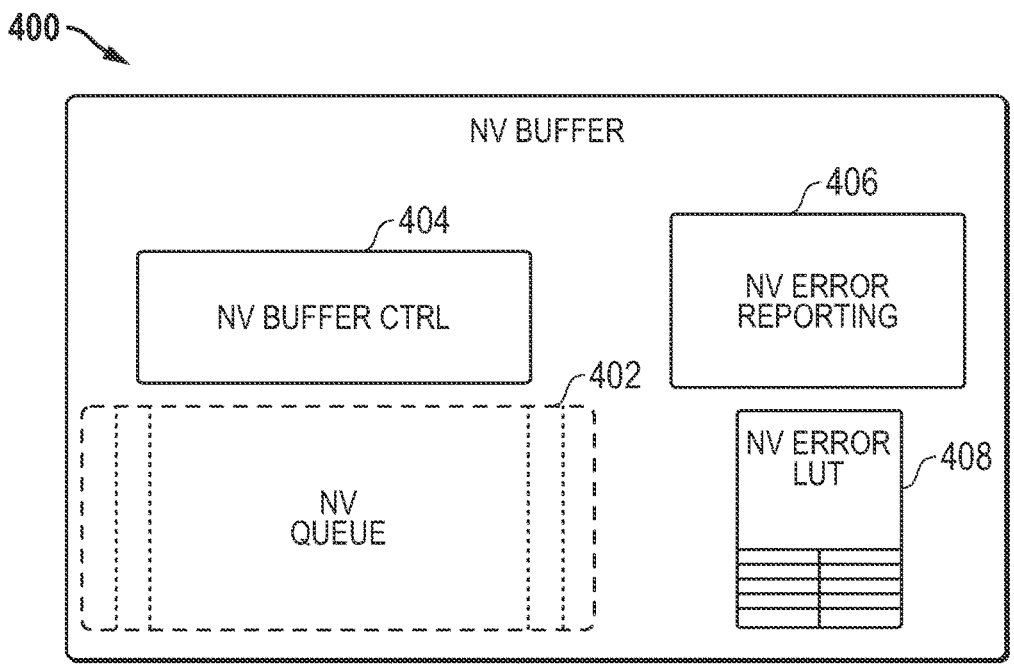
FIG. 4 illustrated in block diagram form a non-volatile buffer according to some embodiments.

FIG. 4 illustrates in block diagram form an NV buffer 400 according to some embodiments. NV buffer 400 is an exemplary instantiation of NV buffer 247 (FIG. 2). NV buffer 400 includes a non-volatile command queue ("NV queue") 402, a non-volatile buffer control circuit ("NV buffer CTRL") 404, a non-volatile error reporting circuit ("NV error reporting") 406, and a non-volatile error lookup table ("NV error LUT") 408.

NV queue 402 is coupled to the output of the command queue 220 (FIG. 2) for receiving non-volatile read commands, and stores them as they await fulfillment. NV queue 402 stores non-volatile read commands to provide them for replay when a recovery sequence is triggered requiring replay of commands.

NV buffer CTRL 404 handles ready response signals ("RD_RDY") received from the non-volatile DIMM indicating that responsive data is available for an associated one of the non-volatile read commands. In response, NV buffer CTRL 404 causes a SEND command to be placed in the memory interface queue for issuance to the non-volatile DIMM to cause it to send the responsive data. When responsive data is received, NV buffer CTRL 404 identifies the associated non-volatile read command in NV queue 402 using a read ID ("RID"), and removes the associated non-volatile read command from the non-volatile queue.

NV error reporting circuit 406 is connected to ECC check circuit 242 and replay control logic 231 for receiving error codes indicating data errors and link errors associated with the NVDIMM-P or other non-volatile DIMM. The errors are mapped from a first number of possible error conditions indicated by error type identifiers associated with the non-volatile DIMM to a second, smaller number virtual error types for reporting to an error monitoring module of a host operating system. In this embodiment, the mapping is accomplished using NV error LUT 408, which is indexed for lookups using the error type identifiers describing the data or link errors. The result of the lookups is a virtual error type for reporting to the error monitoring module, as further described below with respect to FIG. 5 and FIG. 6.

Figure 5:
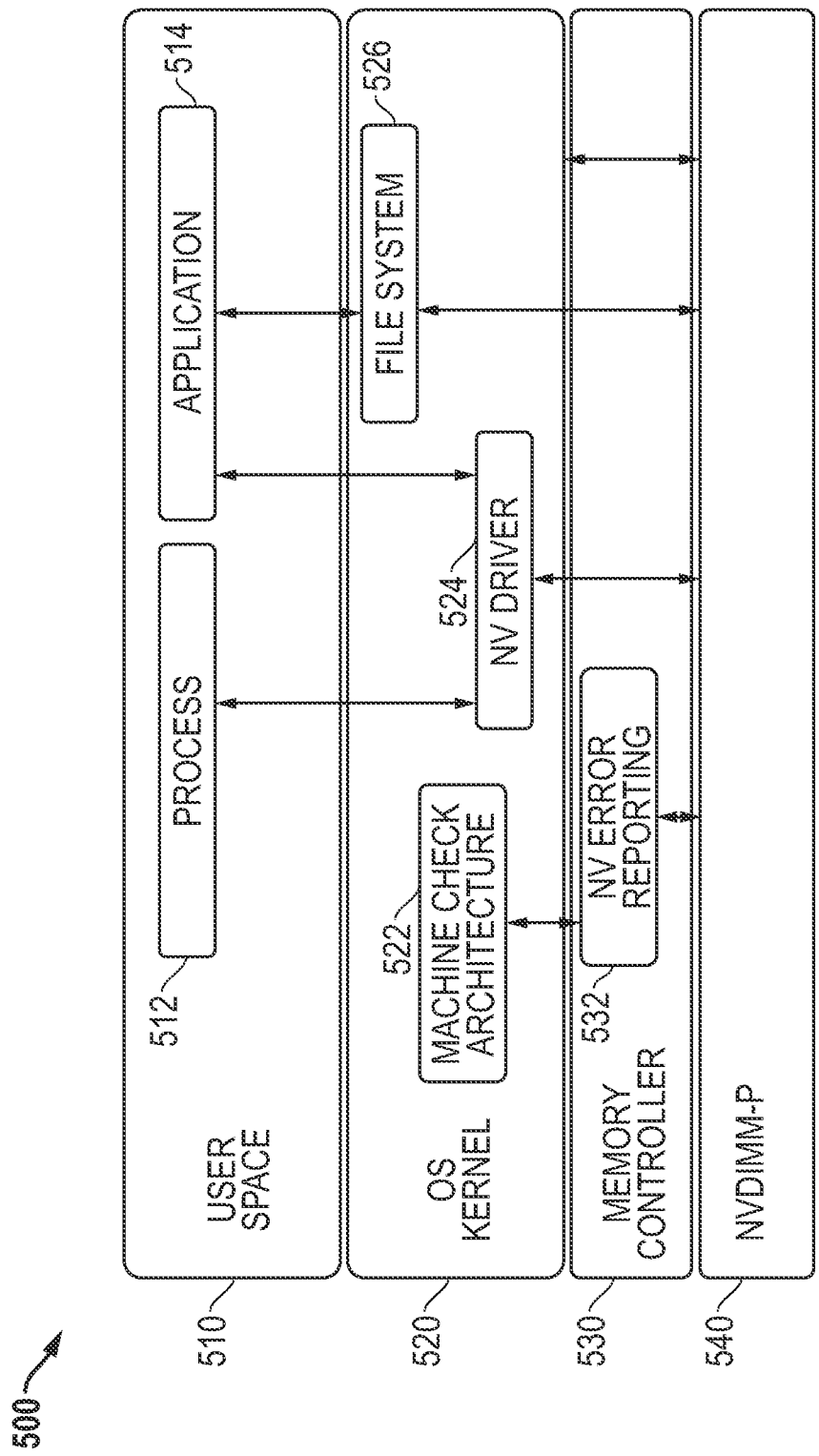
FIG. 5 is a block diagram illustrating non-volatile memory usage on a computer system according to some embodiments.

FIG. 5 is a block diagram illustrating non-volatile memory usage on a computer system 500 according to some embodiments. The depicted software and hardware components are suitable for use with a data processing system as described with respect to FIGS. 2-4. System 500 includes a user space 510 hosted by an operating system kernel ("OS kernel") 520, a memory controller 530, and a non-volatile DIMM, in this embodiment an NVDIMM-P 540.

OS kernel 520 is typically a server OS, but in some implementations is another type of OS such as a personal computer OS or an OS specialized for a particular computational task. OS kernel 520 runs on a system processor such as APU 310 (FIG. 3), and hosts a user space 510 running user processes 512 and user applications 514. OS kernel 520 includes an error monitoring module such as machine check architecture 522, a non-volatile DIMM driver ("NV driver") 524, and a file system 526. Many other parts of OS kernel 520 are not shown in order to focus on components that access the non-volatile DIMMs. In some embodiments, multiple OS kernels are present as virtual machines hosted by a hypervisor layer.

While machine check architecture 522 is depicted in this implementation, other types of error reporting modules are used in other implementations. Machine check architecture 522 is a known mechanism to provide error reporting from error detection logic in many parts of data processing system 500 to OS kernel 520 and higher level software such as a virtual machine manager, applications, and processes. Machine check architecture 522 is able to process errors, and recover from certain errors, by determining if corrected data can be obtained and executing software routines to correct the errors. In certain conditions, machine check architecture 522 determines that execution of a particular process cannot proceed based on determining that corrected data cannot be obtained. In such a case, machine check architecture 522 is able to process the error by passing control to higher-level software or forcing a reset.

NV driver 524 is a driver module executing on OS kernel 520 for providing access to memory in NVDIMM-P 540. As depicted, NV driver 524 fulfills memory access instructions from process 512 and application 514 (which has one or more executing processes). To fulfill the instructions, NV driver 524 formats the instructions as appropriate requests to NVDIMM-P 540 through memory controller 530. For example, non-volatile read and non-volatile write requests from NV driver 524 may result in XREAD and WRITE commands at memory controller 530.

File system 526 executes on OS kernel 520 to manage data files that include data stored in NVDIMM-P 540. File system 526 may have native support to interface with NVDIMM-P 540, or may also employ NV driver 524 to handle accesses. OS kernel 520 also accesses NVDIMM-P 540 through memory controller 530 for its own memory access needs.

Memory controller 530 in this embodiment is an implementation of memory controller 200 (FIG. 2) or a similar memory controller suitable for accessing NVDIMM-P 540, and includes NV error reporting logic 532 corresponding to NV error reporting logic 406 (FIG. 4). In some embodiments, NV error reporting logic 532 reports errors to machine check architecture 522 using error reporting information determined according to the process of FIG. 6 discussed further below.

The use of persistent memory such as NVDIMM-P provides a number of challenges in dealing with error reporting and the associated reliability, accessibility, and serviceability (RAS) issues. Such challenges result from the multitude of new error types that occur with non-volatile DIMMS as compared to DRAM DIMMs, which have very few error types. While the error types are defined for certain non-volatile DIMMs such as NVDIMM-P, the manner in which errors are handled and reported to the system is generally not specified, for example in the draft NVDIMM-P standard.

Figure 6:
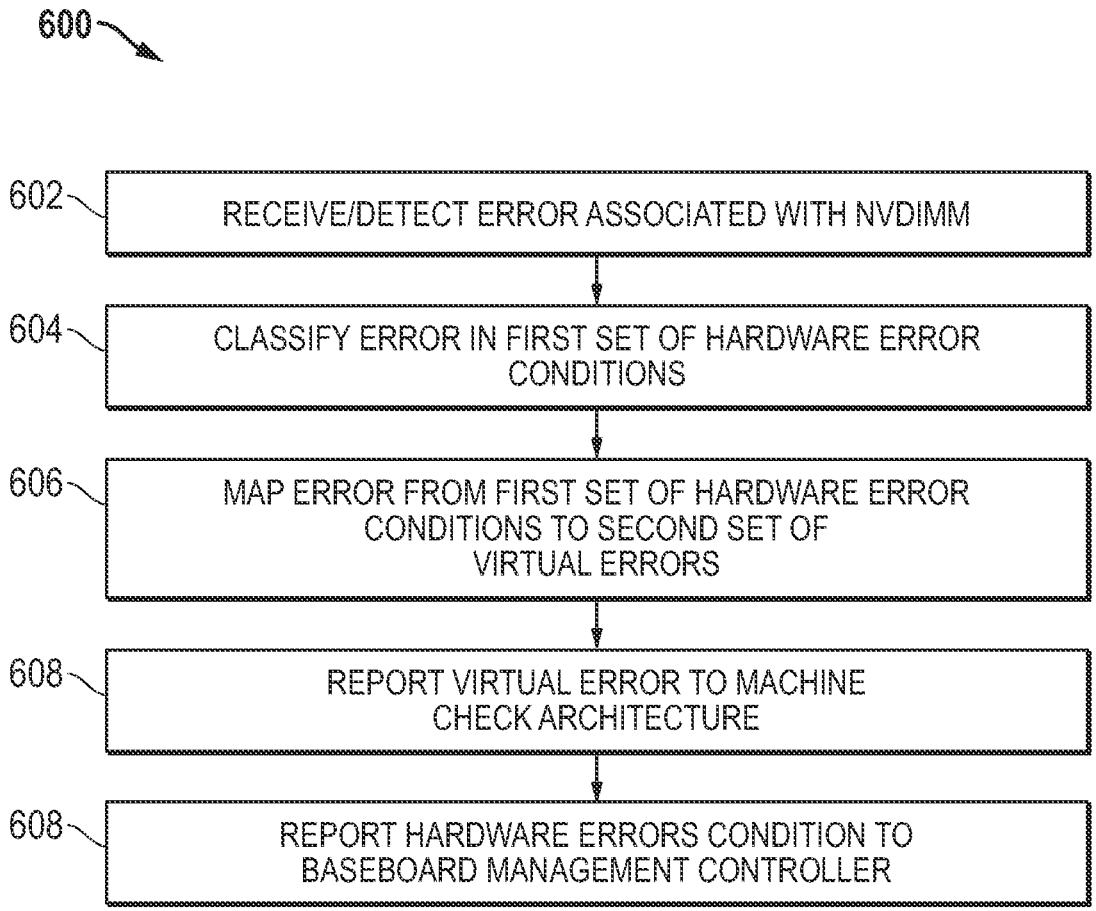
FIG. 6 is a flow diagram of a process for error reporting according to some embodiments.

FIG. 6 is a flow diagram of process 600 for reporting errors according to some embodiments. Process 600 is suitable for implementation with memory controller 200 of FIG. 2, or other memory controller arrangements, and is performed in this embodiment by the NV error reporting logic 406 (FIG. 4) in cooperation with replay logic control circuit 231 (FIG. 2).

Generally, process 600 handles errors detected at the memory controller and reports them in a manner suitable for error management and fault management within the system. Error management describes actions necessary by operational software, for example the operating system, to manage running programs that may be affected by the error. Error management is controlled by the operating system's error monitoring module, such as machine check architecture 522, and generally includes a limited set of responses to errors, such as taking no action, terminating a single affected process, program, or virtual machine, and terminating the system operation. As such, the error monitoring module requires only the error information needed to make decisions about the scope and severity of the error, and to determine what immediate action is to be taken. Fault Management describes optional actions for purposes of diagnosis, repair, and reconfiguration of the underlying hardware. Fault management capability is found in various parts of the data processing system, and for severe faults is directed by BMC 340 (FIG. 3).

Referring to process 600, the process starts at block 602 in which it receives an error notification from the non-volatile DIMM, or detects an error at the memory controller, such as a link ECC error detected by ECC check circuit 242 (FIG. 2). Errors reported by the non-volatile DIMM include various types of DRAM errors, media errors (concerning the non-volatile media), cache errors (concerning the cache on the non-volatile DIMM), and thermal errors. Some non-volatile DIMMs report other kinds of errors such as firmware initialization errors. Link errors include transmission errors over the memory channel such as link ECC errors. Host errors are detected at the memory controller and include non-volatile read command timeouts and duplicate RID errors.

Generally, errors reported from a non-volatile DIMM such as an NVDIMM-P have three overall categories: Alert, Urgent, and Interrupt. However, these categories are not sufficient to report an error for error management or fault management as discussed above. These various types of errors provide several dozen individual error identifiers each representing error conditions associated with the non-volatile DIMM. At block 604, the error identifier is used to classify the error based on the specific hardware conditions associated with the error. Such a classification may be performed in advance and the results held in a table at the memory controller such as NV error LUT 408. The classification is based at least on whether the error condition will or will not have a deleterious effect on an executable process running on the host operating system. Such a determination is typically based on whether the error indicates that data is lost and not recoverable, for example through buffer overflows or bit errors in memory media. The mapping may also be made based on the type of effect that the error condition will have on the executable process. For example, if instruction data is lost a process may be restarted based on saved user data. Such an option may not be available if user data is lost.

At block 606, the error conditions are mapped from a first number of possible error conditions associated with the non-volatile DIMM to a second, smaller number of virtual error types. The virtual error types are selected based on virtual errors used by the data processing system's error monitoring module such as machine check architecture 522 (FIG. 5). In this embodiment, the virtual error types have a numbered severity level that is used for reporting to the error monitoring module at block 608. The virtual error types are then employed to determine what error management response will be taken by the error management module.

While the virtual error type is used for reporting to the error management module, the original error identifier based on the error conditions is reported to BMC 340 at block 610. Associated data such as addresses or instructions involved may also be reported. The reporting mechanism typically loads the information to a register that is polled on behalf of BMC 340, but other suitable reporting mechanisms are used in other embodiments. BMC 340 employs the information for error logging and performing fault management functions such as diagnosing hardware faults and repairing or reconfiguring hardware to mitigate faulty conditions.

Thus, a memory controller and data processing system as described herein improves the ability of the memory controller to handle errors associated with non-volatile DIMMs on a heterogenous memory channel. The techniques herein also provide a mechanism to report non-volatile DIMM error conditions to the system error monitoring module in a way that can be used by the existing error reporting mechanisms for DIMMs. Furthermore, the techniques herein provide an error handling capability that does not depend on variable or unknown methods that may be employed by various non-volatile DIMM vendors to report errors. Instead errors are classified by the memory controller, which appropriately reports the errors to error management and/or fault management mechanisms.

Memory controller 200 of FIG. 2 or any portions thereof, such as arbiter 238, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the internal architecture of memory channel controller 210 and/or power engine 250 may vary in different embodiments. Memory controller 200 may interface to other types of memory besides NVDIMM-P and DDRx, such as high bandwidth memory (HBM), RAMbus DRAM (RDRAM), and the like. While the illustrated embodiment showed each rank of memory corresponding to separate DIMMs, in other embodiments each DIMM can support multiple ranks. Further, while a heterogenous memory channel is generally supported, the heterogenous channel may be filled entirely with non-volatile DIMMs.

Accordingly, it is intended by the appended claims to cover all modifications of the disclosed embodiments that fall within the scope of the disclosed embodiments.

What is claimed is:

1. A memory controller, comprising:
   a memory channel controller adapted to dispatch memory access commands addressable in a system memory address space to a non-volatile storage class memory (SCM) module; and
   a non-volatile error reporting circuit operable to identify error conditions associated with the non-volatile SCM module and map the error conditions from a first number of possible error conditions associated with the non-volatile SCM module to a second, smaller number of virtual error types for reporting to an error monitoring module of a host operating system, the mapping based at least on a classification that the error condition will or will not have a deleterious effect on an executable process running on the host operating system.

2. The memory controller of claim 1, wherein the non-volatile error reporting circuit is further operable to report the virtual error types to the error monitoring module of the host operating system.

3. The memory controller of claim 1, wherein the non-volatile error reporting circuit is further operable to report the error conditions to a baseboard management controller of a host data processing system.

4. The memory controller of claim 1, wherein the error conditions include interrupt type errors and urgent type errors.

5. The memory controller of claim 1, wherein the non-volatile error reporting circuit includes a lookup table indexed at least by error codes associated with the error conditions and containing associated virtual error types for the error codes.

6. The memory controller of claim 1, wherein the mapping includes a determination of a type of effect that the error condition will have on the executable process.

7. The memory controller of claim 1, wherein the mapping includes a determination of a severity level reported to the error monitoring module.

8. A method, comprising:
   receiving a plurality of memory access requests addressable in a system address space;
   dispatching commands associated with the memory access requests to a memory channel coupled to a non-volatile storage class memory (SCM) module;
   based on information received over the memory channel, identifying error conditions associated with the memory channel; and
   mapping the error conditions from a first number of possible error conditions associated with the non-volatile SCM module to a second, smaller number of virtual error types for reporting to an error monitoring module of a host operating system, the mapping based at least on a classification that the error condition will or will not have a deleterious effect on an executable process running on the host operating system.

9. The method of claim 8, further comprising reporting the virtual error types to the error monitoring module of the host operating system.

10. The method of claim 8, further comprising reporting the error conditions to a baseboard management controller.

11. The method of claim 8, wherein the error conditions include interrupt type errors and urgent type errors.

12. The method of claim 8, further comprising indexing a lookup table at least by error codes associated with the error conditions obtaining associated virtual error types for the error codes.

13. The method of claim 8, wherein the mapping includes a determination of a type of effect that the error condition will have on the executable process.

14. The method of claim 8, wherein the mapping includes determining a severity level to be reported to the error monitoring module.

15. A data processing system, comprising:
a central processing unit;
a data fabric coupled to the central processing unit; and
a memory controller coupled to the data fabric for fulfilling memory access requests made through the data fabric, the memory controller comprising:
  a memory channel controller adapted to receive and dispatch commands addressable in a system memory address space to a non-volatile storage class memory (SCM) module; and
  a non-volatile error reporting circuit operable to identify error conditions associated with the non-volatile SCM module and map the error conditions from a first number of possible error conditions associated with the non-volatile SCM module to a second, smaller number of virtual error types for reporting to an error monitoring module of a host operating system, the mapping based at least on a classification that the error condition will or will not have a deleterious effect on an executable process running on the host operating system.

16. The data processing system of claim 15, wherein the non-volatile error reporting circuit is further operable to report the virtual error types to the error monitoring module of the host operating system.

17. The data processing system of claim 15, further comprising a baseboard management controller coupled to the central processing unit, wherein the non-volatile error reporting circuit is further operable to report the error conditions to a baseboard management controller.

18. The data processing system of claim 15, wherein the error conditions include interrupt type errors and urgent type errors.

19. The data processing system of claim 15, wherein the non-volatile error reporting circuit includes a lookup table indexed at least by error codes associated with the error conditions and containing associated virtual error types for the error codes.

20. The data processing system of claim 15, wherein the mapping includes a determination of a severity level reported to the error monitoring module.

\* \* \* \* \*